United States Patent
Orcutt et al.

(10) Patent No.: US 11,730,067 B2
(45) Date of Patent: Aug. 15, 2023

(54) QUBIT-OPTICAL-CMOS INTEGRATION USING STRUCTURED SUBSTRATES

(71) Applicant: International Business Machines Corporation, Armonk, NY (US)

(72) Inventors: Jason S. Orcutt, Katonah, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 17/214,156

(22) Filed: Mar. 26, 2021

(65) Prior Publication Data

US 2021/0217809 A1      Jul. 15, 2021

Related U.S. Application Data

(62) Division of application No. 16/261,158, filed on Jan. 29, 2019, now Pat. No. 10,998,376.

(51) Int. Cl.
| | |
|---|---|
| *H01L 27/18* | (2006.01) |
| *G06N 10/00* | (2022.01) |
| *G02B 6/293* | (2006.01) |
| *H01L 39/02* | (2006.01) |
| *H01L 39/22* | (2006.01) |

(52) U.S. Cl.
CPC .......... *H01L 27/18* (2013.01); *G02B 6/29341* (2013.01); *G06N 10/00* (2019.01); *H01L 39/025* (2013.01); *H01L 39/223* (2013.01)

(58) Field of Classification Search
CPC ..... H01L 27/18; H01L 39/025; H01L 39/223; G02B 6/29341; G02B 6/29338; G02B 6/12004; G06N 10/00; G02F 1/0356
See application file for complete search history.

(56) References Cited

U.S. PATENT DOCUMENTS

| | | | |
|---|---|---|---|
| 5,682,455 | A | 10/1997 | Kovacic et al. |
| 6,762,869 | B2 | 7/2004 | Maleki et al. |
| 6,871,025 | B2 | 3/2005 | Maleki et al. |
| 7,561,770 | B2 | 7/2009 | Ty Tan et al. |
| 7,972,882 | B2 | 7/2011 | Tan et al. |

(Continued)

FOREIGN PATENT DOCUMENTS

| | | |
|---|---|---|
| CN | 85104652 A | 12/1986 |
| CN | 1359158 A | 7/2002 |

(Continued)

OTHER PUBLICATIONS

Rueda et al., "Efficient microwave to optical photon conversion: an electro-optical realization," Optica, vol. 3, No. 6, pp. 597-604 (Jun. 2016).

(Continued)

*Primary Examiner* — Cuong B Nguyen
(74) *Attorney, Agent, or Firm* — Erik Johnson; Michael J. Chang, LLC

(57) ABSTRACT

Techniques for the integration of SiGe/Si optical resonators with qubit and CMOS devices using structured substrates are provided. In one aspect, a waveguide structure includes: a wafer; and a waveguide disposed on the wafer, the waveguide having a SiGe core surrounded by Si, wherein the wafer has a lower refractive index than the Si (e.g., sapphire, diamond, SiC, and/or GaN). A computing device and a method for quantum computing are also provided.

20 Claims, 3 Drawing Sheets

(56) References Cited

U.S. PATENT DOCUMENTS

| | | | |
|---|---|---|---|
| 7,991,025 B2 | 8/2011 | Maleki et al. |
| 8,175,429 B2 | 5/2012 | Tan et al. |
| 8,831,056 B2 | 9/2014 | Savchenkov et al. |
| 9,531,055 B2 | 12/2016 | Abraham et al. |
| 9,564,573 B1 | 2/2017 | Chang et al. |
| 9,773,208 B2 | 9/2017 | Betz et al. |
| 9,857,609 B2 | 1/2018 | Bishop et al. |
| 9,885,888 B2 | 2/2018 | Bishop et al. |
| 9,971,970 B1 | 5/2018 | Rigetti et al. |
| 11,230,776 B2 | 1/2022 | Mills |
| 2002/0021765 A1 | 2/2002 | Maleki et al. |
| 2003/0003735 A1 | 1/2003 | Deliwala |
| 2003/0179974 A1 | 9/2003 | Estes et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2005/0104684 A1 | 5/2005 | Wojcik et al. |
| 2005/0163445 A1 | 7/2005 | Hanashima et al. |
| 2006/0051010 A1 | 3/2006 | Chu et al. |
| 2007/0025670 A1 | 2/2007 | Pan et al. |
| 2008/0310463 A1 | 12/2008 | Maleki et al. |
| 2009/0003841 A1 | 1/2009 | Ghidini et al. |
| 2009/0032805 A1 | 2/2009 | Ty Tan et al. |
| 2009/0180748 A1 | 7/2009 | Stewart et al. |
| 2009/0206242 A1 | 8/2009 | Mizaikoff et al. |
| 2009/0239323 A1 | 9/2009 | Tan et al. |
| 2009/0256136 A1 | 10/2009 | Tan et al. |
| 2010/0311229 A1 | 12/2010 | Einav |
| 2011/0044362 A1 | 2/2011 | Wada et al. |
| 2012/0039346 A1 | 2/2012 | Liang et al. |
| 2013/0003766 A1 | 1/2013 | Savchenkov et al. |
| 2015/0316794 A1 | 11/2015 | Hayakawa |
| 2015/0340584 A1 | 11/2015 | Chang et al. |
| 2016/0197391 A1 | 7/2016 | Li et al. |
| 2016/0292587 A1 | 10/2016 | Rigetti et al. |
| 2017/0207600 A1 | 7/2017 | Klamkin et al. |
| 2018/0211158 A1 | 7/2018 | Shainline et al. |
| 2020/0243601 A1 | 7/2020 | Orcutt et al. |

FOREIGN PATENT DOCUMENTS

| | | |
|---|---|---|
| CN | 1961254 A | 5/2007 |
| CN | 101258434 A | 9/2008 |
| CN | 102017076 A | 4/2011 |
| CN | 102243340 A | 11/2011 |
| CN | 102419460 A | 4/2012 |
| CN | 106646738 A | 5/2017 |
| CN | 107077893 A | 8/2017 |
| CN | 107111060 A | 8/2017 |
| FR | 3046853 A1 | 7/2017 |
| JP | H02368 A | 1/1990 |
| JP | H04159521 A | 6/1992 |
| JP | H05157924 A | 6/1993 |
| JP | 2003067181 A | 3/2003 |
| JP | 2005215075 A | 8/2005 |
| JP | 2018004444 A | 1/2018 |
| JP | 2018136316 A | 8/2018 |

OTHER PUBLICATIONS

Devoret et al., "Superconducting Qubits: A Short Review," arXiv:cond-mat/0411174 (Feb. 2008) (41 pages).

Ekanayake et al., "Characterization of SOS-CMOS FETs at Low Temperatures for the Design of Integrated Circuits for Quantum Bit Control and Readout," IEEE Transactions on Electron Devices, vol. 57, No. 2, pp. 539-547 (Feb. 2010).

Clement Javerzac-Galy et al., "On-chip microwave-to-optical quantum coherent converter based on a super-conducting resonator coupled to an electro-optic microresonator," arXiv:1512.06442v2, Aug. 2016 (5 pages).

Teresa Brecht et al., "Multilayer microwave integrated quantum circuits for scalable quantum computing," npj Quantum Information, vol. 2, Feb. 2016, 16002 (4 pages).

A. Bruno et al., "Reducing intrinsic loss in superconducting resonators by surface treatment and deep etching of silicon substrates," Applied Physics Letters, vol. 106, No. 18, May 2015, 182601 (4 pages).

M. Gebski et al., "Monolithic high-index contrast grating: a material independent high-reflectance VCSEL mirror," Optics Express, vol. 23, No. 9, Apr. 24, 2015, pp. 11674-11686, XP055685702, DOI: 10.1364/OE.23.011674.

Y. Nakayama et al., "Optical Frequency Comb by using an Optical Waveguide & a Cavity," The 50th JSAP Meeting, The Japan Society of Applied Physics, 2003, vol. 3 (1 page).

S. Bunyaev et. al., "Microstrip Whispering-Gallery-Mode Resonator," IEEE Transactions on Microwave Theory and Techniques, vol. 63, No. 9, pp. 2776-2781 (Sep. 2015).

International Search Report and Written Opinion for PCT/EP2020/051287 dated Apr. 29, 2020 (11 pages).

List of IBM Patents or Applications Treated as Related, Mar. 26, 2021 (2 pages).

Shigeaki Sekiguchi et al., "Si-Based Optical Switch with SiGe Waveguide Core," 2010 Autumn 71th JASP Annual Meetings Extended Abstracts, 17p-G-8, The Japan Society of Applied Physics, 2010, 05-131 (2 total pages).

Tsybeskov et al., "Silicon-Germanium Nanostructures for Light Emitters and On-Chip Optical Interconnects," Proceedings of the IEEE, vol. 97, No. 7, p. 1284-1303 (Jul. 2009) (21 total pages).

English Translation of Office Action for Japanese Patent Application No. 2021-533555 dated Feb. 9, 2023 (5 pages).

QUBIT-OPTICAL-CMOS INTEGRATION USING STRUCTURED SUBSTRATES

FIELD OF THE INVENTION

The present invention relates to optical resonators, and more particularly, to the integration of silicon germanium (SiGe)/silicon (Si) optical resonators with quantum bit (i.e., "qubit") and complementary metal oxide semiconductor (CMOS) devices using structured substrates.

BACKGROUND OF THE INVENTION

The ability to link microwave electrical signals and optical photons for quantum information processing requires efficient conversion between the microwave and optical domains. See, for example, Rueda et al., "Efficient microwave to optical photon conversion: an electro-optical realization," Optica, vol. 3, no. 6, pp. 597-604 (June 2016).

A microwave-to-optical transducer can be employed for this conversion. See, for example, U.S. Pat. No. 9,857,609 issued to Bishop et al., entitled "Integrated Microwave-to-Optical Single-Photon Transducer with Strain-Induced Electro-Optic Material" (hereinafter "U.S. Pat. No. 9,857,609") which describes a quantum computing device having a transducer for converting single-photon microwave signals to optical signals. U.S. Pat. No. 9,857,609 provides an integrated optical design incorporating qubits, a transducer and an optical resonator that operate in conjunction to convert microwave signals from the qubits to optical signals. The optical signals couple with a waveguide and are transmitted to their destination. However, by employing a silicon germanium (SiGe) on silicon (Si) substrate architecture, optical leakage can be a concern.

Accordingly, improved designs for integrating quantum computing and optical devices on a common substrate wafer would be desirable.

SUMMARY OF THE INVENTION

The present invention provides techniques for the integration of SiGe/Si optical resonators with qubit and CMOS devices using structured substrates. In one aspect of the invention, a waveguide structure is provided. The waveguide structure includes: a wafer; and a waveguide disposed on the wafer, the waveguide having a SiGe core surrounded by Si, wherein the wafer has a lower refractive index than the Si. For example, the wafer can include a material such as sapphire, diamond, silicon carbide (SiC), and/or gallium nitride (GaN).

In another aspect of the invention, a computing device is provided. The computing device includes: a waveguide structure having a wafer, and a waveguide disposed on the wafer, the waveguide being a resonator-based microwave-to-optical transducer having a SiGe core surrounded by Si, wherein the wafer has a lower refractive index than the Si; qubits disposed on the wafer; superconducting bus paths between the waveguide and the qubits; and FETs disposed on the wafer connecting the superconducting bus paths between the waveguide and the qubits.

In yet another aspect of the invention, a method for quantum computing is provided. The method includes: providing a computing device that includes: (i) a waveguide structure having a wafer, and a waveguide disposed on the wafer, the waveguide being a resonator-based microwave-to-optical transducer having a SiGe core surrounded by Si, wherein the wafer has a lower refractive index than the Si, (ii) qubits disposed on the wafer, (iii) superconducting bus paths between the waveguide and the qubits, and (iv) FETs disposed on the wafer connecting the superconducting bus paths between the waveguide and the qubits; selecting one of the superconducting bus paths between the waveguide and a given one of the qubits; routing a microwave signal from the given one of the qubits along the one of the superconducting bus paths that has been selected; and converting the microwave signal to an optical signal via the resonator-based microwave-to-optical transducer.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for the integration of silicon germanium/silicon (SiGe/Si) optical resonators/transducers with quantum bit (qubit) and complementary metal oxide semiconductor (CMOS) devices using structured substrates (e.g., substrates formed from multiple materials). The structured substrates have a silicon-on-X (SOX) configuration, where X is a wafer having a material with i) a lower refractive index than Si and ii) a radio frequency (RF) loss tangent at microwave frequencies of $<1\times10^{-5}$ at 10 mK for the qubit operation. By way of example only, suitable materials X that can meet these qualifications include, but are not limited to, sapphire, diamond, silicon carbide (SiC) and/or gallium nitride (GaN).

A unique SiGe/Si optical resonator is provided whereby this structured SOX substrate provides a secondary, higher index contrast interface to the SiGe/Si waveguide definition. The present structured substrate-based optical resonator designs have the following notable benefits. First, the thickness and germanium (Ge) mole fraction of the SiGe layers can be reduced while achieving the same radiation limited quality factor due to the refractive index contrast the lower refractive index X wafer, e.g., sapphire, diamond, SiC and/or GaN, provides. The refractive index contrast provided by the lower refractive index X wafer reduces the spatial extent of the evanescent optical mode and therefore enables the closer placement of a bottom electrode to the waveguide, which enhances performance by increasing the single photon field strength for quantum applications.

As will be described in detail below, according to an exemplary embodiment, the present SiGe/Si optical resonators are integrated with qubit and CMOS devices (e.g., transistors) on the same SOX structured substrate. These devices can be connected together to have new functionality. Further, techniques are presented herein for introducing reconfiguration capability in networks of qubits and microwave-optical transducers using reconfigurable electrical routing by the transistors.

Figure 1:
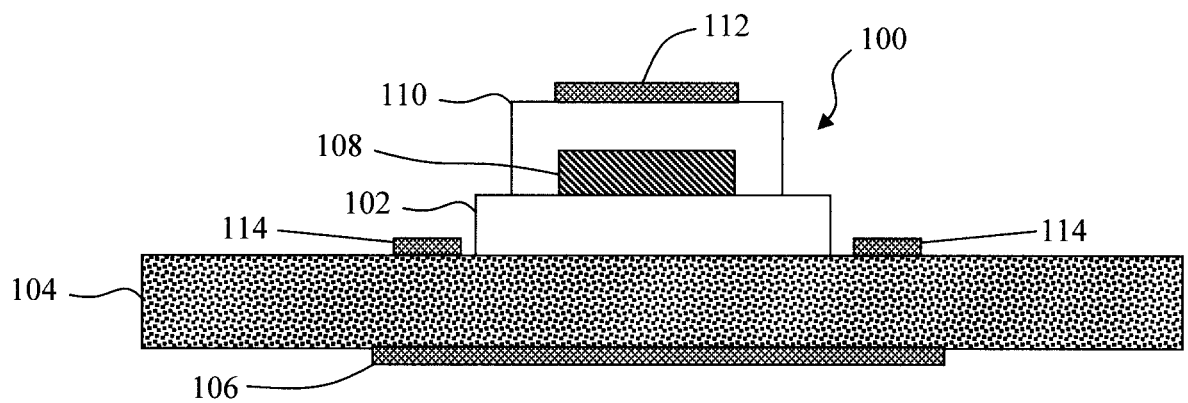
FIG. 1 is a cross-sectional diagram illustrating an exemplary waveguide structure according to an embodiment of the present invention.

FIG. 1 is a diagram illustrating an exemplary waveguide structure in accordance with the present techniques. As shown in FIG. 1, waveguide structure includes a waveguide 100 disposed on a low refractive index wafer 104, i.e., wafer 104 has a lower refractive index than Si layer 102. As provided above, suitable materials for wafer 104 include, but are not limited to, sapphire, diamond, SiC and/or GaN. The lower index wafer under the waveguide 100 serves to truncate the evanescent optical field (for example allowing the placement of a bottom electrode 106 closer to the waveguide 100) and minimize radiation loss. As will be described in detail below, fabrication of the waveguide structure (and optional associated computing components such as qubits and/or routing transistors) can begin with an SOX wafer, i.e., Si layer 102 on X material (e.g., sapphire, diamond, SiC and/or GaN) wafer 104.

Specifically, waveguide 100 includes a SiGe core 108 surrounded by Si layer 102 and an Si layer 110. SiGe core 108 has a refractive index that is higher than the refractive index of the Si layers 102/110. With this material combination and configuration, the waveguide 100 provides primary modal index guiding.

The present waveguide 100 can have a variety of different applications. For instance, the present waveguide 100 can be employed as an optical routing waveguide for transmitting optical signals and/or as an optical ring resonator filter. For an optical ring resonator filter, waveguide 100 is configured as a closed loop optical ring resonator which acts as a filter for light of a certain (resonant) wavelength.

According to an exemplary embodiment of the present techniques, waveguide 100 is employed as a microwave-to-optical transducer that converts signals from qubits at microwave frequencies into optical signals at a telecommunication frequency (e.g., about 1550 nanometers (nm) wavelength). See, for example, exemplary computing device 500, described in conjunction with the description of FIG. 5, below. As described in detail below, multiple physical superconducting bus paths can be present between the qubits and the transducer with multiple transistors connecting the paths. The transistors provide for reconfigurable connections (electrical routing) to the transducer. Advantageously, the qubits, CMOS transistors, and transducer are all integrated on a single common SOX substrate.

Figure 2:
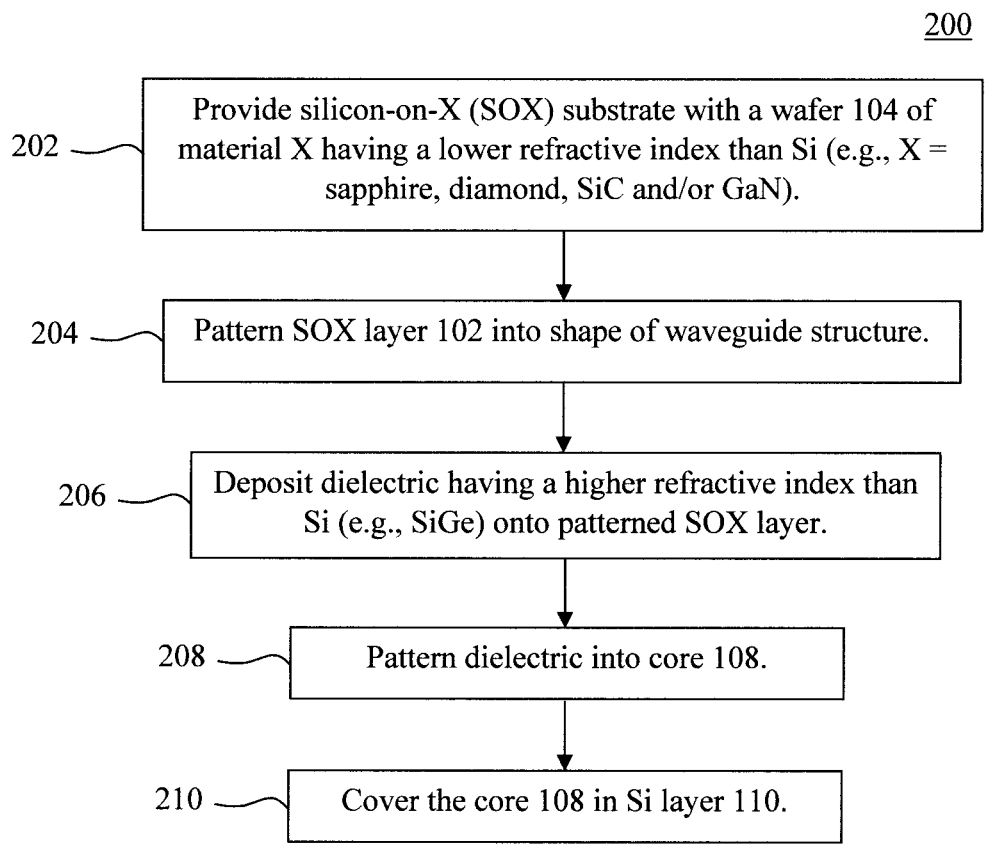
FIG. 2 is a diagram illustrating an exemplary methodology for forming the present waveguide structure according to an embodiment of the present invention.

For use as a microwave-to-optical transducer, waveguide 100 preferably includes a bottom electrode 106, a top electrode 112, and bias electrodes 114. As shown in FIG. 1, bottom electrode 106 is disposed on a side of the wafer 104 opposite the waveguide 100, top electrode 112 is disposed on the waveguide 100 (i.e., on top of the Si layer 110), and the bias electrodes 114 are disposed on the wafer 104 on opposite sides of the waveguide 100. These electrodes form a transmission line resonator in which there is a standing wave radio frequency (RF) field. Microwave frequencies generally refer to those RF frequencies of greater than or equal to about 1 gigahertz (GHz). Thus, the transmission line resonator spatially overlaps the RF and optical modes. According to an exemplary embodiment, the Kerr electro-optic effect or DC Kerr effect is used for microwave-to-optical conversion. As known in the art, the DC Kerr effect refers to a change in the refractive index of a material in response to a slowly varying electrical field applied to the sample material. Here, the electric field in applied via the bias electrodes 114 or by backgating the waveguide 100 via the bottom electrode 106 through the wafer 104. As provided above, the refractive index contrast provided by the lower refractive index X wafer 104 reduces the spatial extent of the evanescent optical mode which enables the closer placement of the bottom electrode 106 to the waveguide 100, and thus enhances performance by increasing the single photon field strength. As will be described in conjunction with the description of FIG. 2 below, the top electrode 112 can be configured as a crescent shape over the optical ring resonator forming a quarter-wave RF resonator which provides close integration of the electrode with the optical ring resonator.

Standard CMOS-compatible fabrication process can be employed to form the waveguide structure. See, for example, methodology 200 of FIG. 2. By way of example only, the process begins in step 202 with a SOX substrate having an SOX layer 102 (a Si layer) on lower refractive index X wafer 104 (e.g., sapphire, diamond, SiC and/or GaN).

In step 204, standard lithography and etching techniques are then employed to pattern the SOX layer 102 into the respective shape of waveguide structure using, e.g., a directional (anisotropic) etching process such as reactive ion etching (RIE). For instance, the SOX layer 102 can be patterned into an optical routing waveguide of any shape. For instance, for use as an optical ring resonator filter or optical ring resonator-based microwave-to-optical transducer, the SOX layer 102 is patterned into a closed loop/ring.

In step 206, SiGe is disposed (i.e., deposited, grown, etc.) on the patterned SOX layer 102. SiGe has a refractive index that is higher than the refractive index of Si. In step 208, standard lithography and etching techniques are then employed to pattern the SiGe the shape of core 108 using, e.g., a directional (anisotropic) etching process such as RIE. The patterned core 108 will have the same general shape as the patterned SOX layer 102.

Finally, in step 210, the core 108 is covered in an Si layer 110 to complete the waveguide structure 100. Again, standard lithography and etching techniques can be employed to pattern the Si layer 110 into the respective shape of the waveguide 100 surrounding the core 108.

Figure 3:
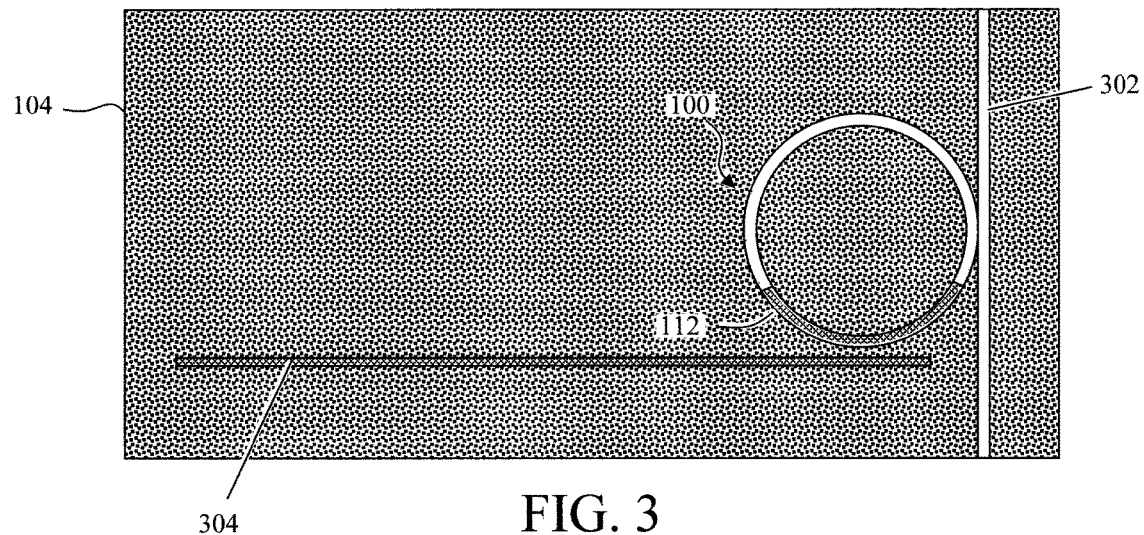
FIG. 3 is a top-down diagram illustrating the present waveguide structure forming a closed loop optical ring resonator-based microwave-to-optical transducer according to an embodiment of the present invention.

FIG. 3 is a top-down diagram illustrating an exemplary embodiment wherein the waveguide 100 forms a closed loop optical ring resonator-based microwave-to-optical transducer. As is visible from the top-down view in FIG. 3, the waveguide 100 is an optical ring resonator formed on lower refractive index X wafer 104 (e.g., sapphire, diamond, SiC and/or GaN). The top electrode 112 is configured as a crescent over the waveguide 100 forming a quarter-waver RF resonator (see above). For clarity, the bias electrode and/or ground plane is omitted from this drawing.

The waveguide 100 is optically coupled to a routing waveguide bus 302. Routing waveguide bus 302 transfers optical signals waveguide 100 to their destination. According to an exemplary embodiment, the routing waveguide bus 302 is formed on wafer 104 in the same manner as waveguide 100 and includes the same components, e.g., SOX layer/Si layer 110 surrounding a (e.g., SiGe) core 108.

However, routing waveguide bus 302 would not need the electrodes 106/112/114 associated with the transducer.

A microwave waveguide 304 is also optically coupled to the waveguide 100. In general, the microwave waveguide 304 can be any waveguide bus for carrying microwave photons. For instance, according to an exemplary embodiment, the microwave waveguide 304 is formed on wafer 104 in the same manner as waveguide 100 and includes the same components, e.g., SOX layer/Si layer 110 surrounding a (e.g., SiGe) core 108. As will be described in detail below, embodiments are provided herein where waveguide 100 is integrated on wafer 104 with other quantum computing devices, such as qubits and optionally transistors for reconfigurable connections (electrical routing) from the qubits to the transducer. In that case, microwave waveguide 304 can be employed as a signal bus to the transducer. See below.

Figure 4:
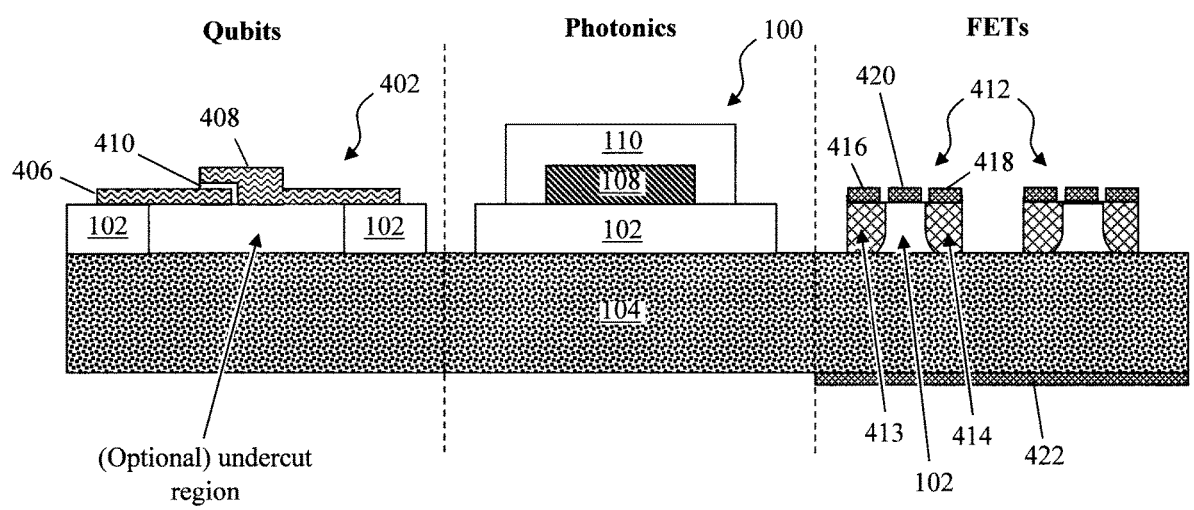
FIG. 4 is a cross-sectional diagram illustrating qubits, photonics and routing field-effect transistors (FETs) integrated on a common lower refractive index wafer according to an embodiment of the present invention.
Figure 5:
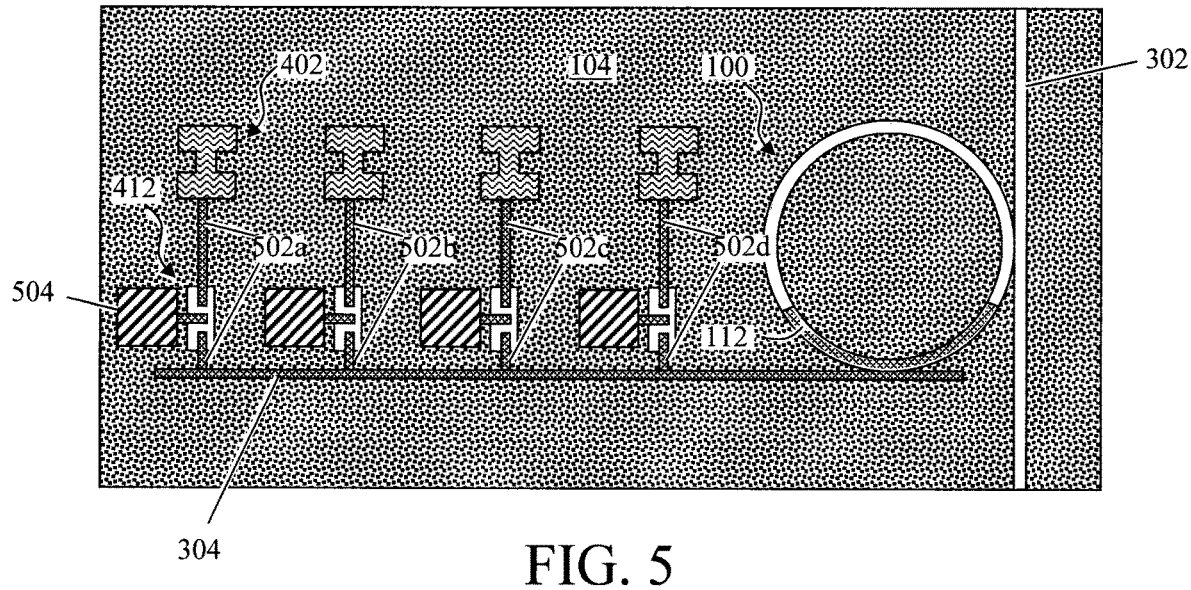
FIG. 5 is a top-down diagram illustrating an exemplary quantum computing device containing qubits, photonics and FET components integrated on a common lower refractive index wafer according to an embodiment of the present invention.

For instance, FIG. 4 is a cross-sectional diagram illustrating qubits, photonics and routing field-effect transistors (FET) integrated on a common lower refractive index X wafer 104 (e.g., sapphire, diamond, SiC and/or GaN). An exemplary layout of these devices is described in conjunction with the description of FIG. 5, below. First, regarding the photonics component, as shown in FIG. 4 the integrated design includes at least one waveguide 100. Namely, as provided above, the present waveguide 100 can be configured as an optical routing waveguide(s) and/or an optical ring resonator filter, as well as an optical ring resonator-based microwave-to-optical transducer. Thus, one or more of these devices can be incorporated into the present design. As shown in FIG. 5, and as described above, each waveguide 100 includes, e.g., SOX layer/Si layer 110 surrounding a SiGe core 108.

At least one qubit is formed on the common lower refractive index X wafer 104. For instance, as shown in FIG. 4, each qubit includes a qubit circuit 402 formed on the SOX layer 102. Optionally, a region of the SOX layer 102 is undercut beneath the qubit circuit 402 such that the qubit circuit is suspended over the wafer 104.

According to an exemplary embodiment, the qubit circuit 402 is a Josephson tunnel junction formed by two superconducting thin films (i.e., a superconducting bottom electrode 406 and a superconducting top electrode 408) separated by an insulator 410. The Josephson tunnel junction is described generally in Devoret et al., "Superconducting Qubits: A Short Review," arXiv:cond-mat/0411174 (February 2008) (41 pages), the contents of which are incorporated by reference as if fully set forth herein. Suitable materials for the superconducting bottom/top electrodes 406/408 include, but are not limited to, aluminum (Al) and/or titanium nitride. Suitable materials for the insulator 410 include, but are not limited to, oxides such as aluminum oxide ($Al_2O_3$). For instance, according to an exemplary embodiment, superconducting bottom electrode 406/insulator 410/superconducting top electrode 408 are $Al/Al_2O_3/Al$, respectively.

Standard CMOS-compatible processes may be employed to fabricate the qubit(s) on the wafer 104. Qubit fabrication techniques that may be employed in accordance with the present techniques are described, for example, in U.S. Patent Application Publication Number 2015/0340584 by Chang et al., entitled "Suspended Superconducting Qubits" (hereinafter "U.S. Patent Application Publication Number 2015/0340584"), the contents of which are incorporated by reference as if fully set forth herein.

Optionally, a region of the SOX layer 102 is undercut beneath the bottom electrode 406 such that the qubit is suspended over the wafer 104. By way of example only, the SOX layer 102 can be undercut using a zenon difluoride ($XeF_2$) etch. Undercutting the SOX layer 102 is undercut beneath the qubit circuit 402 is beneficial as it removes the substrate-to-metal interface and moves the substrate-to-metal interface further away from the electric fields of the resonant modes of the quantum circuit. See U.S. Patent Application Publication Number 2015/0340584.

According to an exemplary embodiment, at least one FET 412 is formed on the common lower refractive index X wafer 104. See FIG. 4. In general, each FET 412 includes a channel interconnecting a source and a drain, and a gate for regulating current flow through the channel. In this exemplary embodiment, the channel is formed from the SOX layer 102. Any standard FET designs including, but not limited to, planar or non-planar FET configurations such as finFETs, nanowire/nanosheet FETs, etc. may be implemented in accordance with the present techniques. The techniques for forming these planar and non-planar FET designs are well known in the art.

Source and drains 413 and 414 are formed on opposite ends of the channel/SOX layer 102. According to an exemplary embodiment, the source and drains 413 and 414 are formed from an in-situ or ex-situ doped epitaxial material such as phosphorous-doped silicon (Si:P) or boron-doped SiGe (SiGe:B). Contacts 416 and 418 are formed to the source and drains 413 and 414, respectively.

A top gate 420 and/or a bottom gate 422 can be implemented to regulate current flow through the channel. Each gate generally includes a conductor or combination of conductors separated from the channel by a gate dielectric. Suitable gate conductors include, but are not limited to, doped poly-silicon and/or metals such as titanium (Ti), tantalum (Ta), titanium nitride (TiN), tantalum nitride (TaN), and/or tungsten (W). Suitable gate dielectrics include, but are not limited to, silicon oxide (SiOx) and/or high-x dielectrics such as hafnium oxide ($HfO_2$) and/or lanthanum oxide ($LaO_2$).

An exemplary quantum computing device 500 containing qubits, photonics and FET components integrated on a common lower refractive index X wafer 104 is shown in FIG. 5 (a top-down view). Specifically, as shown in FIG. 5, device 500 includes qubits 402 interconnected via multiple physical superconducting bus paths 502a,b,c,d, etc. to waveguide 100 which is configured as an optical ring microwave-to-optical transducer. Multiple FETs 412 connect the superconducting bus paths 502a,b,c,d, etc. between the waveguide 100 and the qubits 402. Each of these device components, which was described in detail above, is disposed on wafer 104.

FETs 412 enable reconfigurable electrical routing between the waveguide 100 and the qubits 402 allowing the devices to be connected together to have new functionality. For instance, each superconducting bus paths 502a,b,c,d, etc. is connected to a separate FET 412. See FIG. 5. Namely, each superconducting bus paths 502a,b,c,d, etc. is connected to the source and drains (i.e., source and drains 413 and 414—see FIG. 4) of the respective FET 412. A contact 504 is provided to the gate (i.e., top gate 420 and/or a bottom gate 422—see FIG. 4) of each FET 412. Applying a gate voltage (via contact 504) to a FET 412 switches the respective FET 412 from a high resistance state between the source and drains of that FET 412 to a low resistance state between the source and drains. The superconducting bus paths 502a,b,c,d, etc. with the low resistance switch is then where the microwave signal will be routed. See, for example, methodology 600 of FIG. 6.

Figure 6:
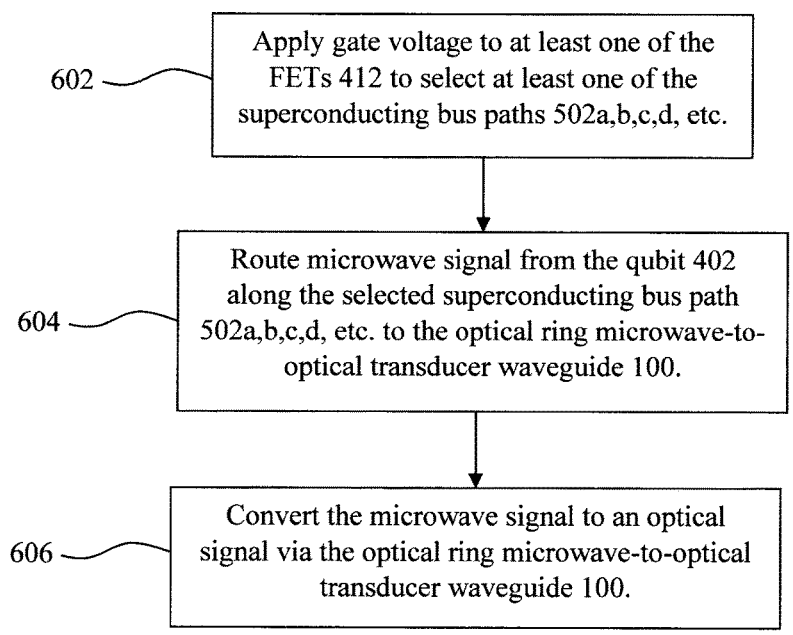
FIG. 6 is a diagram illustrating an exemplary methodology for quantum computing according to an embodiment of the present invention.

Namely, FIG. 6 provides an exemplary methodology 600 for quantum computing using a device such as quantum computing device 500 of FIG. 5. As provided above, computing device 500 includes qubits 402 interconnected via multiple physical superconducting bus paths 502a,b,c,d, etc. to optical ring microwave-to-optical transducer waveguide 100. Multiple FETs 412 connect the superconducting bus paths 502a,b,c,d, etc. between the waveguide 100 and the qubits 402.

In step 602, a gate voltage is applied to at least one of the FETs 412 to select at least one of the superconducting bus paths 502a,b,c,d, etc. Namely, as provided above, each superconducting bus paths 502a,b,c,d, etc. is connected to the source and drains (i.e., source and drains 413 and 414—see FIG. 4) of the respective FET 412, and applying a gate voltage (via contact 504) to a FET 412 switches the respective FET 412 from a high resistance state between the source and drains of that FET 412 to a low resistance state between the source and drains.

In step 604, a microwave signal is routed from the qubit 402 along the selected superconducting bus path 502a,b,c,d, etc. to the optical ring microwave-to-optical transducer waveguide 100. Namely, as provided above, the superconducting bus paths 502a,b,c,d, etc. with the low resistance switch is where the microwave signal will be routed. In step 606, the optical ring microwave-to-optical transducer waveguide 100 converts the microwave signal to an optical signal.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for quantum computing, the method comprising:
   providing a computing device that includes: (i) a waveguide structure comprising a wafer, and a waveguide disposed on the wafer, the waveguide comprising a resonator-based microwave-to-optical transducer having a silicon germanium (SiGe) core surrounded by silicon (Si), wherein the wafer has a lower refractive index than the Si, (ii) quantum bits (qubits) disposed on the wafer, (iii) superconducting bus paths between the waveguide and the qubits, and (iv) field effect transistors (FETs) disposed on the wafer connecting the superconducting bus paths between the waveguide and the qubits;
   selecting one of the superconducting bus paths between the waveguide and a given one of the qubits;
   routing a microwave signal from the given one of the qubits along the one of the superconducting bus paths that has been selected; and
   converting the microwave signal to an optical signal via the resonator-based microwave-to-optical transducer.

2. The method of claim 1, wherein the wafer comprises a material selected from a group consisting of: sapphire, diamond, silicon carbide (SiC), gallium nitride (GaN), and combinations thereof.

3. The method of claim 1, wherein the superconducting bus paths are connected to sources and drains of the FETs.

4. The method of claim 3, wherein the selecting of the one of the superconducting bus paths comprises:
   applying a gate voltage to a given one of the FETs along the one of the superconducting bus paths to switch the given one of the FETs from a high resistance state between the sources and drains to a low resistance state between the sources and drains.

5. The method of claim 1, wherein the waveguide has a ring shape.

6. The method of claim 1, wherein the waveguide structure further comprises a top electrode disposed on the waveguide.

7. The method of claim 6, wherein the top electrode has a crescent shape.

8. The method of claim 1, wherein the waveguide structure further comprises a bottom electrode disposed on a side of the wafer opposite the waveguide.

9. The method of claim 1, wherein the waveguide structure further comprises bias electrodes disposed on the wafer on opposite sides of the waveguide.

10. The method of claim 1, wherein each of the qubits comprises a superconducting bottom electrode on a Si layer; and a superconducting top electrode separated from the superconducting bottom electrode by an insulator.

11. The method of claim 10, wherein the Si layer is undercut beneath the superconducting bottom electrode such that each of the qubits is suspended over the wafer.

12. A method for quantum computing, the method comprising:
   providing a computing device that includes: (i) a waveguide structure comprising a wafer, and a waveguide disposed on the wafer, the waveguide comprising a resonator-based microwave-to-optical transducer having a SiGe core surrounded by Si, wherein the wafer has a lower refractive index than the Si, (ii) quantum bits (qubits) disposed on the wafer, (iii) superconducting bus paths between the waveguide and the qubits, and (iv) field effect transistors (FETs) disposed on the wafer connecting the superconducting bus paths between the waveguide and the qubits, wherein the superconducting bus paths are connected to sources and drains of the FETs, and wherein each of the FETs comprises a top gate or a bottom gate to regulate current flow through a channel between the sources and drains, and a contact to the top gate or the bottom gate;
   selecting one of the superconducting bus paths between the waveguide and a given one of the qubits by applying a gate voltage, via the contact, to a given one of the FETs along the one of the superconducting bus paths to switch the given one of the FETs from a high resistance state between the sources and drains to a low resistance state between the sources and drains;
   routing a microwave signal from the given one of the qubits along the one of the superconducting bus paths that has been selected; and
   converting the microwave signal to an optical signal via the resonator-based microwave-to-optical transducer.

13. The method of claim 12, wherein the wafer comprises a material selected from a group consisting of: sapphire, diamond, SiC, GaN, and combinations thereof.

14. The method of claim 12, wherein the waveguide has a ring shape.

15. The method of claim 12, wherein the waveguide structure further comprises a top electrode disposed on the waveguide.

16. The method of claim 15, wherein the top electrode has a crescent shape.

17. The method of claim 12, wherein the waveguide structure further comprises a bottom electrode disposed on a side of the wafer opposite the waveguide.

18. The method of claim 12, wherein the waveguide structure further comprises bias electrodes disposed on the wafer on opposite sides of the waveguide.

19. The method of claim 12, wherein each of the qubits comprises a superconducting bottom electrode on a Si layer; and a superconducting top electrode separated from the superconducting bottom electrode by an insulator.

20. The method of claim 19, wherein the Si layer is undercut beneath the superconducting bottom electrode such that each of the qubits is suspended over the wafer.

* * * * *